United States Patent [19]

Patalong

[11] Patent Number: 4,755,861
[45] Date of Patent: Jul. 5, 1988

[54] LIGHT-FIRABLE THYRISTOR

[75] Inventor: Hubert Patalong, Munich, Fed. Rep. of Germany

[73] Assignee: Siemens Aktiengesellschaft, Berlin & Munich, Fed. Rep. of Germany

[21] Appl. No.: 524,595

[22] Filed: Aug. 19, 1983

Related U.S. Application Data

[63] Continuation of Ser. No. 199,521, Oct. 22, 1980, abandoned.

[30] Foreign Application Priority Data

Nov. 9, 1979 [DE] Fed. Rep. of Germany ....... 2945335

[51] Int. Cl.[4] ............................................ H01L 29/74
[52] U.S. Cl. ............................................ 357/38; 357/4; 357/30; 357/86
[58] Field of Search ................... 357/23, 38, 86, 30

[56] References Cited

U.S. PATENT DOCUMENTS

| 3,891,866 | 6/1975 | Okuhara et al. | 357/38 |
| 4,016,592 | 4/1977 | Yatsuo et al. | 357/38 |
| 4,224,634 | 9/1980 | Svedberg | 357/38 |
| 4,238,761 | 12/1980 | Schlegel et al. | 357/38 |

Primary Examiner—Joseph E. Clawson, Jr.
Attorney, Agent, or Firm—Hill, Van Santen, Steadman & Simpson

[57] ABSTRACT

A light-firable thyristor has two emitter layers and two base layers therebetween. One of the emitter layers comprises a plurality of partial layers one of which has a light-active semiconductor region. Each of the emitter layers has an additional region therein which in combination with the partial layer and the base layer adjacent the partial layer forms a gate controlled MIS structure for providing a controllable emitter short circuit path between each partial layer in the base layer adjacent therewith. The short circuit path is opened during initial device firing to provide increased sensitivity but which is shorted at other times to provide operational stability.

14 Claims, 1 Drawing Sheet

U.S. Patent  Jul. 5, 1988  4,755,861
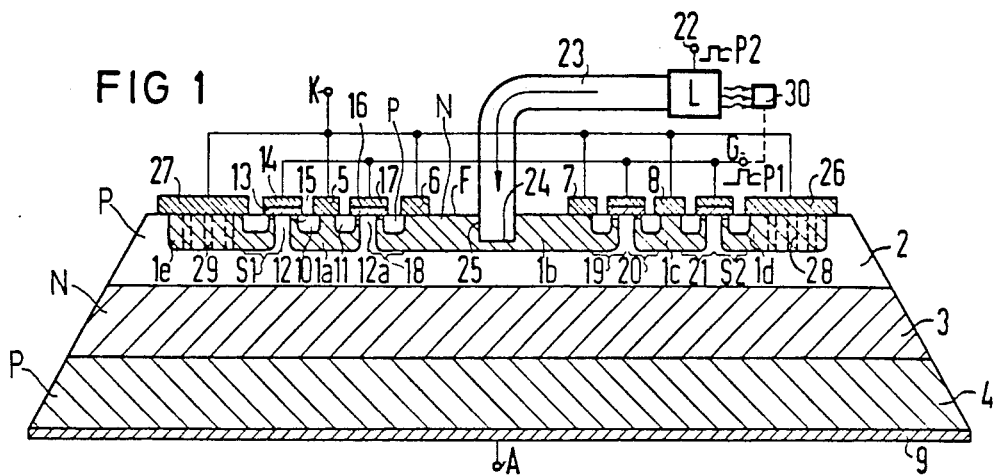
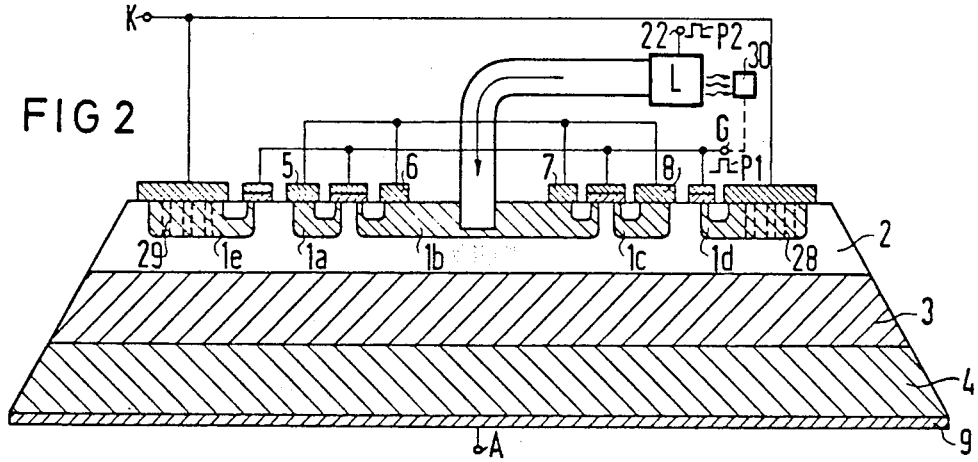

LIGHT-FIRABLE THYRISTOR

This is a continuation of application Ser. No. 199,521, filed Oct. 22, 1980 now abandoned.

BACKGROUND OF THE INVENTION

The invention concerns a light-firable or activatible thyristor formed of a semiconductor body having an N-emitter layer provided with a first electrode, a P-emitter layer provided with a second electrode, and two base layers therebetween.

Light-firable thyristors are mentioned, for example, in the book by E. Spenke, "pn-Transitions" (Vol. 5 of the Series "Semiconductor Electronics"), Springer Publishing Company, Berlin, 1979, on page 119, incorporated herein by reference. Their firing sensitivity must be accommodated to controlled light sources which have only a small light power. If one increases the firing sensitivity by means of the elimination of fixed emitter short circuits, then one simultaneously decreases the stability of the thyristor, that is, its insensitivity to undesired firing processes.

SUMMARY OF THE INVENTION

It is an object of the invention to provide a light-firable thyristor which is accommodated to light sources with a small light power and still displays good stability. This problem is solved according to the invention by providing one of the N-emitter or P-emitter layers having partial regions which are selectively connected to an underlying base layer by controllable emitter short circuit paths formed by MIS structures.

The advantage which is attainable with the invention is that controllable emitter short circuit paths are inactive and electrically open (high resistance) during the firing process, whereby the firing tendency of the thyristor is greatly increased. In the blocked state of the thyristor, they are constantly connected (low resistance path) so that a good stability behavior is attained.

BRIEF DESCRIPTION OF THE DRAWINGS

FIG. 1 shows a cross section through a first embodiment of the invention; and

FIG. 2 shows a cross section through a second embodiment thereof.

DESCRIPTION OF THE PREFERRED EMBODIMENTS

The thyristor presented in FIG. 1 has a semiconductor body with semiconductor layers 1 through 4 of different conductivity types, which, for example, consist of doped silicon. Thereby, the N-conducting layer 1 which lies on the outside, which is subdivided into three partial layers 1a through 1c, is designated as an N-emitter layer, and the P-conducting layer 4 which lies on the outside is designated as a P-emitter layer. The P-conducting layer 2 and the N-conducting layer 3 represent the so-called base layers. The partial layers 1a through 1c are provided with portions 5 through 8 of a first electrode, which are connected in conducting fashion with one another. In FIG. 1, these portions are further connected with a cathode lead K, so that in the case of the first electrode, this involves a cathode. The partial layers 1a through 1c can be designed to be strip-shaped and run perpendicular to the plane of the drawing of FIG. 1. In this case, also the members 5 through 8 of the cathode are designed strip-shaped and they run in the same direction. The P-emitter layer 4 is provided with a second electrode 9, which is connected with an anode lead A and thus represents an anode.

In the partial layer 1a, P-conducting semiconductor regions 10, 11 are inserted in such a manner that they extend up to the interface of the semiconductor body. Thereby, they are contacted in each case on the edge side by the portion 5 of the cathode. With 12 and 12a, zones of the base layer 2 are designated which reach up to the interface F. The region 10 thereby forms a first P-region, the zone 12 a second P-region, and the portion of the partial layer 1a which lies in between these represents an N-intermediate layer. Upon the interface F there is a thin electrically insulating layer 13 provided, for example, of $SiO_2$, on which a gate 14 is arranged in such a manner that it covers the N-intermediate layer. The parts 10, 1a, 12, 13 and 14 form a MIS structure. If they belong to the depletion type, then without action of a voltage on the gate 14, a P-conducting inversion channel 15 is located at the interface F between the regions 12, which connects these regions with one another so as to be conducting. If one applies a positive gate voltage at a gate voltage lead G of the gate 14, then the inversion channel 15 is eliminated. If the MIS structure is of the enhancement type, then in the case of a voltageless gate 14, no inversion channel 15 exists. This is built up only by means of applying a negative gate voltage at G by inversion of the partial layer 1a below the gate 14.

Therefore, the inversion channel 15 together with the regions 10 and 12 represents a controller emitter short circuit path which connects the base layer 2 with the region 10 and thus with the portion 5 of the cathode in dependence upon a gate voltage which is supplied to the lead G and thus provides a low resistance.

By means of the arrangement of an electrically insulating layer 16, for example of $SiO_2$, on which a gate 17 also connected with G is provided in an analogous manner, there results a MIS structure 11, 1a, 12a, 16 and 17, in which, in dependence upon the gate voltage lying at G, an emitter short circuit path either is or is not connected to be operative between the base layer 2 and the portion 5 of the cathode. Other emitter short circuit paths result in each case between the base layer 2 and the parts 6, 7 and 8. These are designated by means of the reference numerals 18, 19, 20 and 21. All specified emitter short circuit paths are controlled in a practical manner via the lead G which is connected with its gate leads.

In the case of MIS structures of the depletion type, the emitter short circuit paths are operative in each case in the case of no voltage on lead G. Thereby, the thyristor is in the blocked state wherein despite a voltage which is poled in the conducting direction at the leads A and K, practically no current flows between the latter. The thermally generated hole electrons are diverted from the base layer 2 to the portions 5 through 8 of the cathode, so that no discharge carriers are injected into the base layer 2 from the N-emitter partial layers 1a through 1c. There thus exists a state of low firing sensitivity or, respectively, high stability.

If one supplies a positive voltage pulse P1 to the lead G, then the emitter short circuit path is connected to be inoperative only for the duration of P1. Additionally, a controllable light source L, in particular a luminescent diode, a laser diode or such, is provided via a lead 22 with a control pulse P2, which causes a radiation of a portion of the semiconductor body by means of a fiber optic wave guide 23, for example, a glass fiber optic wave guide. Therefore, charge carriers are generated under the end 24 of the fiber optic wave guide 23 by means of the light effect in the base layer 2. These charge carriers, together with the thermally generated charge carriers, cause the N-emitter partial layers 1a through 1c which lie in the vicinity of the light-active semiconductor region to inject charge carriers into the base layer 2. The thyristor fires even at small light powers of the light source L. Following this, a load current of a load circuit which is connected at A and K flows via the thyristor which is connected for low resistance. The disconnection of the same is in a practical manner attained by means of a disconnection of the load current in the load circuit, or, if the voltage lying at A and K is an alternating voltage, it is attained by means of the following zero crossing.

In some applications, the use of MIS structures of the enhancement type can be desired. Therefore, G constantly lies at a negative bias voltage which during the firing is eliminated by means of a positive pulse P1 or is overcompensated, so that during the firing process, no voltage lies at G, or in the case of the overcompensation, a positive voltage pulse lies at G.

The charge carrier generation in the light-active semiconductor region is intensified in the N-emitter partial layer 1b, if one provides an indentation 25, in which the end 24 of the fiber optic wave guide 23 is inserted.

Instead of the N-emitter layer, also the P-emitter layer 4 can be subdivided into a plurality of emitter partial layers which are associated with individual parts of the anode which are connected among each other. Controllable P-emitter short circuit paths are provided. FIG. 1 can illustrate these variations if the designations of the leads A and K are exchanged with one another, if all semiconductor parts are provided with the opposing conductivity types, and if the voltages or, respectively, voltage pulses which are supplied in each case are repoled. The voltage pulse P1 then has a negative sign. If this concerns MIS structures of the enhancement type, then a positive bias voltage is to be supplied to G, which voltage is eliminated for a short period of time by means of a negative pulse P1, or it is overcompensated.

According to a further design of the invention, in FIG. 1 still further N-emitter partial layers 1d and 1e are provided, which are contacted by further parts of the first electrode or, respectively, cathode, 26 and 27. Also on these partial layers, controllable emitter short circuit paths S1 and S2 can be provided. The partial layers 1d and 1e are penetrated by zones 28, 29 of the base layer 2, which extend to the interface F, and are contacted in each case by the parts 26 and 27. The zones 28 and 29 form fixed emitter short circuits. The thyristor which is supplemented with the partial layers 1d and 1e and which is suitable for larger load currents, is thereby stabilized in the region of the partial layers 1d and 1e by means of the fixed emitter short circuits.

Advantageously, the pulse P1 is tapped at the output of an optical electronic converter 30, for example a photodiode, which is in contact with the controlled light source L. Therefore, a complete electrical separation of the leads of the thyristor from the lead 22 is attained, via which in this case the firing is controlled alone by a voltage which is poled in the conducting direction between A and K.

The embodiment example presented in FIG. 2 differs from FIG. 1 in that the portions 5 through 8 of the first electrode indeed are connected among one another, but are no longer connected with the cathode lead K. Furthermore, the parts 5 and 8 of the first electrode are extended in the direction toward the partial layers 1d and 1e to such an extent that they bridge the PN transitions between the partial layers 1a and 1c and the parts of the base layer 2 which border on these locations. Thereby, the controllable emitter short circuit path 10, 1a, 12, 13 and 14 and the corresponding path 21 is not present. The partial layers 1d and 1e which are further connected with the cathode now form the N main emitter layer, while the partial layers 1a through 1c serve as auxiliary emitter layers. Corresponding to this, the parts 26 and 27 of the first electrode represent the cathode, while the portions 5 through 8 of the first electrode have the significance of an auxiliary emitter electrode. The current which builds up during the firing process between the layers 4 and 1a through 1c represents an auxiliary current which is deflected via the portion 5 and 8 in the direction toward the partial layers 1d and 1e, so that a quick firing proceeds in the region of the latter. The thyristor according to FIG. 2 is suitable because of the inner firing amplification for large slew rates (rapid ascending) of the load current flowing between anode and cathode. Thyristors which are provided with auxiliary emitter electrodes are described on pages 123 and 124 of the previously mentioned publication.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A light-firable thyristor comprising:
    a semiconductor body having an N-emitter layer at one surface of the body contacted with a first electrode thereat;
    a P-emitter layer on another surface of the semiconductor body and contacted with a second electrode thereat;
    N- and P-type base layers between the two emitter layers;
    said N-emitter layer comprising at least two partial layers one of which comprises a light active semiconductor region;
    said first electrode comprising separate electrode parts allocated to each partial layer and electrically connected in common with one another;
    gate controlled MIS (metal-insulator-semiconductor) structure means associated with each partial layer for providing a controllable emitter short circuit path between each partial layer and the P-type base layer which is open during initial device firing to provide increased firing sensitivity and then shorts each of the partial layers to the P-type base layer for operational stability at other times;
    the controllable emitter short circuit paths associated with each partial layer each comprising a first semiconductor region of P-conductivity type, a second semiconductor region of P-conductivity type, and an intermediate region of N-conductivity type lying between the first and second regions and which is covered by a gate electrically insulated with respect to the semiconductor body;

said first semiconductor region being provided within and surrounded by each of the partial layers at an edge zone thereof and extending up to one surface of the semiconductor body and being connected there with a portion of the associated part of the first electrode, another portion of the first electrode part being in contact with the partial layer, said second semiconductor region comprising a portion of said P-type base layer which extends up to said one surface, said intermediate region comprising a portion of the respective N-emitter partial layer at said edge zone thereof, and the gate associated with each MIS structure being electrically commonly connected with the other gates.

2. A thyristor according to claim 1 wherein for adjacent partial layers each having said first semiconductor region of P-conductivity type at an edge zone thereof, the respective MIS structure means for short circuiting each partial layer to the P-type base are provided as a single structure with a single gate overlapping from the P-type first semiconductor region in the one partial layer to the P-type semiconductor region in the other partial layer.

3. A light-firable thyristor, comprising:
a semiconductor body having an N-emitter layer at one surface of the body contacted with a first electrode thereat;
a P-emitter layer on another surface of the semiconductor body and contacted with a second electrode thereat;
N- and P-type base layers between the two emitter layers;
said N-emitter layer comprising at least two partial layers one of which comprises a light active semiconductor region;
said first electrode comprising separate electrode parts allocated to each partial layer and electrically connected in common with one another;
gate controlled MIS (metal-insulator-semiconductor) structure means associated with each partial layer for providing a controllable emitter short circuit path between each partial layer and the P-type base layer which is open during initial device firing to provide increased firing sensitivity and then shorts each of the partial layers to the P-type base layer for operational stability at other times;
the controllable emitter short circuit paths associated with each partial layer each comprising a first semiconductor region of P-conductivity type, a second semiconductor region of P-conductivity type, and an intermediate region of N-conductivity type lying between the first and second regions and which is covered by a gate electrically insulated with respect to the semiconductor body;
said first semiconductor region being provided within and surrounded by each of the partial layers at an edge zone thereof and extending up to one surface of the semiconductor body and being connected there with a portion of the associated part of the first electrode, another portion of the first electrode part being in contact with the partial layer, said second semiconductor region comprising a portion of said P-type base layer which extends up to said one surface, said intermediate region comprising a portion of the respective N-emitter partial layer at said edge zone thereof, and the gate associated with each MIS structure being electrically commonly connected with the other gates;
for adjacent partial layers each having said first semiconductor region of P-conductivity type at an edge zone thereof, the respective MIS structure means for short circuiting each partial layer to the P-type base being provided as a single structure with a single gate overlapping from the P-type first semiconductor region in the one partial layer to the P-type semiconductor region in the other partial layer; and
a partial layer being provided at each side of a central partial layer which comprises the light-active semiconductor region, wherein the central partial layer has two of said first semiconductor regions at opposite side edge zones thereof, and wherein a gate of respective MIS structures associated with the two edge zones overlaps from the respective first semiconductor region of P-conductivity type in the central partial layer to the adjacent partial layer first semiconductor region of P-conductivity type.

4. A light-firable thyristor according to claim 1 wherein for operation of the light-firable thyristor means are provided for producing a voltage pulse which is supplied to the gates of the MIS structures when light is applied for firing.

5. A light-firable thyristor according to claim 1 wherein at least a third partial layer is provided with fixed emitter short circuits to the P-type base.

6. A thyristor according to claim 5 wherein the partial layer with the fixed emitter short circuits connects to a cathode and the commonly connected first electrode parts of the other partial layers are separate from said cathode connection.

7. A thyristor according to claim 1 wherein five partial layers are provided, a central one of the partial layers having the light-active semiconductor region and which is flanked by two partial layers, said two partial layers being in turn flanked by two additional partial layers having fixed emitter short circuit paths to said P-type base.

8. A light-firable thyristor, comprising:
a semiconductor body having an N-emitter layer at one surface of the body contacted with a first electrode thereat;
a P-emitter layer on another surface of the semiconductor body and contacted with a second electrode thereat;
N- and P-type base layers between the two emitter layers;
said P-emitter layer comprising at least two partial layers one of which comprises a light active semiconductor region;
said first electrode comprising separate electrode parts allocated to each partial layer and electrically connected in common with one another;
gate controlled MIS (metal-insulator-semiconductor) structure means associated with each partial layer for providing a controllable emitter short circuit path between each partial layer and the N-type base layer which is open during initial device firing to provide increased firing sensitivity and then shorts each of the partial layers to the N-type base layer for operational stability at other times;
the controllable emitter short circuit paths associated with each partial layer each comprising a first semiconductor region of N-conductivity type, a second semiconductor region of N-conductivity type, and an intermediate region of P-conductivity type lying between the first and second regions and which is covered by a gate electrically insulated with respect to the semiconductor body;

said first semiconductor region being provided within and surrounded by each of the partial layers at an edge zone thereof and extending up to one surface of the semiconductor body and being connected there with a portion of the associated part of the first electrode, another portion of the first electrode part being in contact with the partial layer, said second semiconductor region comprising a portion of said N-type base layer which extends up to said one surface, said intermediate region comprising a portion of the respective P-emitter partial layer at said edge zone thereof, and the gate associated with each MIS structure being electrically commonly connected with the other gates.

9. A thyristor according to claim 8 wherein for adjacent partial layers each having said first semiconductor region of N-conductivity type at an edge zone thereof, the respective MIS structure means for short circuiting each partial layer to the N-type base are provided as a single structure with a single gate overlapping from the N-type first semiconductor region in the one partial layer to the N-type semiconductor region in the other partial layer.

10. A light-firable thyristor, comprising:
a semiconductor body having an N-emitter layer at one surface of the body contacted with a first electrode thereat;
a P-emitter layer on another surface of the semiconductor body and contacted with a second electrode thereat;
N- and P-type base layers betrween the two emitter layers;
said P-emitter layer comprising at least two partial layers one of which comprises a light active semiconductor region;
said first electrode comprising separate electrode parts allocated to each partial layer and electrically connected in common with one another;
gate controlled MIS (metal-insulator-semiconductor) tructure means associated with each partial layer for providing a controllable emitter short circuit path between each partial layer and the N-type base layer which is open during initial device firing to provide increased firing sensitivity and then shorts each of the partial layers to the N-type base layer for operational stability at other times;
the controllable emitter short circuit paths associated with each partial layer each comprising a first semiconductor region of N-conductivity type, a second semiconductor region of N-conductivity type, and an intermediate region of P-conductivity type lying between the first and second regions and which is covered by a gate electrically insulated with respect to the semiconductor body;
said first semiconductor region being provided within and surrounded by each of the partial layers at an edge zone thereof and extending up to one surface of the semiconductor body and being connected there with a portion of the associated part of the first electrode, another portion of the first electrode part being in contact with the partial layer, said second semiconductor region comprising a portion of said N-type base layer which extends up to said one surface, said intermediate region comprising a portion of the respective P-emitter partial layer at said edge zone thereof, and the gate associated with each MIS structure being electrically commonly connected with the other gates;
for adjacent partial layers each having said first semiconductor region of N-conductivity type at an edge zone thereof, the respective MIS structure means for short circuiting each partial layer to the N-type base being provided as a single structure with a single gate overlapping from the N-type first semiconductor region in the one partial payer to the N-type semiconductor region in the other partial layer; and
a partial layer being provided at each side of a central partial layer which comprises the light-active semiconductor region, wherein the central partial layer has two of said first semiconductor regions at opposite side edge zones thereof, and wherein a gate of respective MIS structures associated with the two edge zones overlaps from the respective first semiconductor region of N-conductivity type in the central partial layer to the adjacent partial layer first semiconductor region of N-conductivity type.

11. A light-firable thyristor according to claim 8 wherein for operation of the light-firable thyristor means are provided for producing a voltage pulse which is supplied to the gates of the MIS structures when light is applied for firing.

12. A light-firable thyristor according to claim 8 wherein at least a third partial layer is provided with fixed emitter short circuits to the N-type base.

13. A thyristor according to claim 12 wherein the partial layer with the fixed emitter short circuits connects to·a cathode and the commonly connected first electrode parts of the other partial layers are separate from said cathode connection.

14. A thyristor according to claim 8 wherein five partial layers are provided, a central one of the partial layers having the light-active semiconductor region and which is flanked by two partial layers, said two partial layers being in turn flanked by two additional partial layers having fixed emitter short circuit paths to said N-type base.

* * * * *